Figure 1:
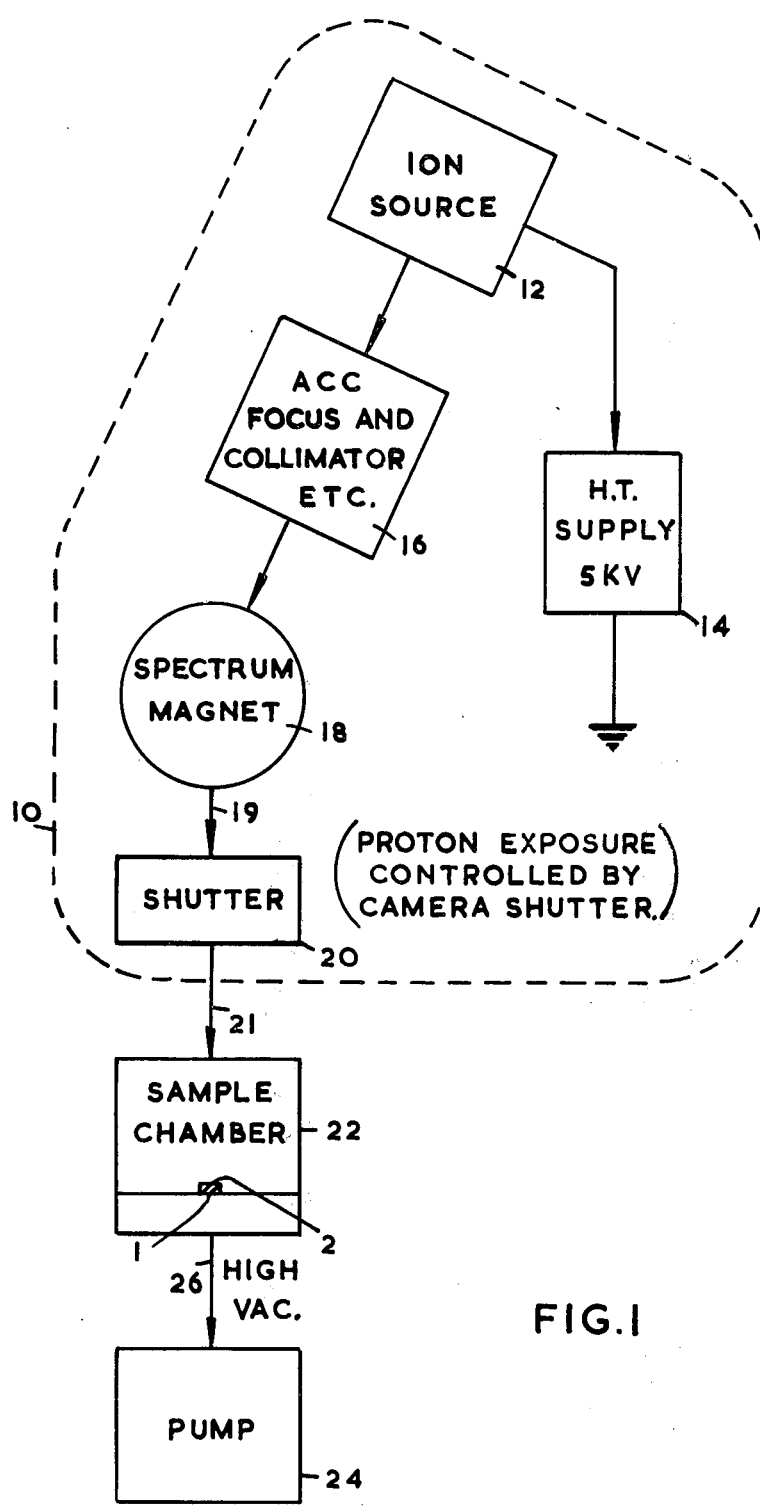

United States Patent [19]

Rain et al.

[11] 4,024,029

[45] May 17, 1977

[54] ELECTRODEPOSITION

[75] Inventors: Norman Rain; Arthur Basil Joseph Sullivan, both of Letchworth, England

[73] Assignee: National Research Development Corporation, London, England

[22] Filed: Oct. 16, 1975

[21] Appl. No.: 623,079

[30] Foreign Application Priority Data

Oct. 17, 1974 United Kingdom ............ 45081/74
Sept. 5, 1975 United Kingdom ............ 36731/75

[52] U.S. Cl. .................................. 204/15; 204/29; 427/43
[51] Int. Cl.² ...................... C25D 5/02; C25D 5/54
[58] Field of Search ........... 204/15, 29, 39; 427/35, 427/43, 54, 92, 299; 96/36.2

[56] References Cited

UNITED STATES PATENTS

| | | | |
|---|---|---|---|
| 3,294,583 | 12/1966 | Fedows-Fedotowsky | 427/43 |
| 3,458,368 | 7/1969 | Haberecht | 427/43 |
| 3,501,342 | 3/1970 | Haberecht et al. | 427/92 |
| 3,506,545 | 4/1970 | Garwin et al. | 204/15 |
| 3,516,855 | 6/1970 | Goll et al. | 427/43 |
| 3,529,961 | 9/1970 | Schaefer et al. | 204/15 |
| 3,551,213 | 12/1970 | Boyle | 427/43 |

FOREIGN PATENTS OR APPLICATIONS 1,295,071 7/1961 France

OTHER PUBLICATIONS

American IEE Transactions on Microwave Theory and Techniques, vol. MTT22, No. 5, May 1974, pp. 510-517.
Mead, Metal-Semiconductor Surface Barriers, Solid State Electronics, vol. 9, pp. 1023-1033.
Formation of Electrical Contacts on Insulating and Semiconducting Diamonds, by A. T. Collins et al., Wheatstone Physics Lab., King's College, London.
Optical Phonon Effects in Absorption and Photoconductivity of Semiconducting Diamond, by J. R. Hardy et al., J. J. Thomson Physical Lab., Univ. of Reading, Reading, Berks, England.

Primary Examiner—T. M. Tufariello
Attorney, Agent, or Firm—Cushman, Darby & Cushman

[57] ABSTRACT

The invention concerns a method of electrodeposition onto a semiconductor. The surface lattice structure of the semiconductor is first disturbed, by an ion beam or otherwise, and then the semiconductor is immersed in an electroplating solution. When the semiconductor is irradiated with light of sufficiently short wavelength to generate free charge carriers therein, ions from the solution are deposited on the semiconductor surface. Metal ions are deposited by this technique only on the disturbed regions of the semiconductor surface, providing an excellent selective deposition process. Multiple layers may be deposited, and even different metals on different regions of the semiconductor surface. The method is particularly suited to the production of solid slate devices such as, for example, gallium arsenide field effect transistors.

21 Claims, 4 Drawing Figures

ELECTRODEPOSITION

This invention relates to methods of electrodepositing materials on semiconductor materials.

It is a particular problem in the semiconductor art to provide ohmic contacts and rectifying junctions, for example, on semiconductor materials. For example to provide ohmic contacts and rectifying junctions on gallium arsenide requires evaporation of metals and sputtering or vacuum deposition employing expensive vacuum equipment.

According to the present invention, a method of depositing material onto a semiconductor includes the steps of:

1. Bombarding the semiconductor with a team of ions to produce damage in or near the surface of the semiconductor,
2. Immersing the semiconductor in an appropriate plating solution,
3. Supplying radiative energy to the semiconductor, the said radiative energy consisting at least partially of wavelengths sufficiently short to generate free charge carriers in the said semiconductor, in order to deposit material from the plating solution onto at least part of the surface of the semiconductor.

It has been found that the present invention provides a particularly cheap and suitable process by which metal contacts may be provided on semiconductor materials. Thus in one aspect of the invention there is provided a method of plating a metal onto a semiconductor in which the plating solution contains ions of the appropriate metal.

The steps carried out as described in the preceding two paragraphs may be followed by heat treatment, if required.

Positive ion bombardment is preferably carried out using hydrogen; however other gases such as nitrogen and argon have been used to bombard gallium arsenide. In this case, however, these heavier particles strike the crystal with greater momentum and, thus, a heat treatment may be required to obtain suitable electrical properties. Successful deposition has also been made by disturbing the lattice structure using negative ion bombardment.

In a preferred aspect of the invention a method of depositing a metal on a semiconductor and in which the metal is electropositive with respect to hydrogen in the electrochemical series comprises bombarding at least part of the surface of the semiconductor to disturb the lattice structure in or near that of the surface of the semiconductor, immersing the semiconductor in an appropriate plating solution containing positive ions of the said metal, supplying radiative energy to the semiconductor to generate free charge carriers in the semiconductor and thereby to effect deposition of the metal from the plating solution on to the bombarded areas of the surface of the semiconductor. The device may require heat treatment to produce the required electrical properties.

The process as described in the preceding paragraph has been carried out successfully on semiconductor materials, in particular gallium arsenide, using silver, gold and platinum.

Very importantly, it is preferred that the energy source is visible light. Visible light is particularly convenient for the deposition of metals on gallium arsenide as plating solutions are generally transparent to light, yet light is absorbed by gallium arsenide to generate free carriers in the semiconductor; it is believed that generated free carriers are important in the deposition mechanism. In some situations, it may be possible to use other energy sources such as radio frequency electromagnetic radiation, ultra-violet or infra-red radiation.

In another aspect of the invention a method of depositing an element on a semiconductor and in which the element forms negative ions when in solution comprises bombarding at least part of the surface of the semiconductor to disturb the lattice structure adjacent that part of the surface of the semiconductor, immersing the semiconductor in an appropriate plating solution containing negative ions of the element, supplying radiative energy to the semiconductor to generate free charge carriers in the semiconductor and thereby to effect deposition of the element from the plating solution on to the non-bombarded areas of the surface of the semiconductor.

The invention is particularly useful for employment where it is only required to plate certain areas of the surface of a semiconductor, for instance where it required only to dope certain very specific areas of a material, for the area exposed to disturbance can be controlled by masking areas during the bombardment or scanning the bombarding material.

It has previously been mentioned that bombardment of a semiconductor will disturb the lattice structure. It is possible to map out a required deposition pattern on a crystal material using negative ions, for example, nitrogen, from a scanning electron microscope using suitable scanning and focussing arrangements.

When plating a metal which is electropositive with respect to hydrogen in the electrochemical series on to lattice disturbed areas of a semiconductor, it has been found that both the extent of lattice disruption in the semiconductor crystal structure and the temperature of the appropriate plating solution are important in determining the nature of the metal/semiconductor contact formed, whether it has rectifying characteristics or whether it has ohmic characteristics. Furthermore it is possible to deposit one metal selected from the group which are more electropositive than hydrogen on top of an already deposited metal layer.

Thus in a further aspect of the invention a method of depositing multiple layers of metals on to a crystal gallium arsenide semiconductor comprises first depositing a first element and subsequently depositing a second element both metals being selected from the group which are more electropositive than hydrogen on top of said first deposited element.

Moreover, once an initial layer of deposit has formed on the semiconductor, it is possible to stop the deposition process and heat-treat the semiconductor, if required, recommencing the deposition process at a later date.

It has also been discovered that different metals require different levels of lattice disruption before they will deposit on semiconductors in accordance with the invention.

Thus it is possible to selectively deposit multiple layers of metals. Thus in a further aspect of the invention a method of depositing layers of metals on gallium arsenide comprises selectively bombarding a portion of the surface of the semiconductor with hydrogen at a dose of less than $5 \times 10^{16}$ ions/sq cm, selectively bombarding a further portion of the surface of the semiconductor with hydrogen at a dose of more than $5 \times 10^{16}$ ions/sq cm, immersing the gallium arsenide in a plating solution containing silver, supplying radiative energy to the gallium arsenide to generate free charge carriers in the semiconductor thereby effecting deposition of a layer of silver on those areas of the surface bombarded a dose of more than $5 \times 10^{16}$ ions/sq cm, subsequently immersing the gallium arsenide in a plating solution containing ions of a second metal being either gold or platinum, supplying radiative energy to the gallium arsenide to generate free charge carriers in the semiconductor and deposition thereby effecting of a layer of said second metal on the gallium arsenide. This procedure is particularly useful in the manufacture of field effect transistors.

It has also been discovered in connection with the present invention that bombardment of the surface of gallium arsenide renders the bombarded area immune to etching, such as by ferri-cyanide, yet the bombarded area still retains the ability to be electroplated. Thus in accordance with a still further aspect of the invention a method of depositing a metal on a semiconductor in accordance with the present invention includes etching the surface of the semiconductor, for example with ferri-cyanide, prior to deposition of metal. By this method, mesas of bombarded semiconductor surface may be produced, each mesa surrounded by an etch pit, and then the mesas may be electroplated.

It is a drawback to the use of electrolytic deposition onto semiconductors that such deposition is accompanied by erosion elsewhere on the semiconductor surface. Such erosion is undesirable, since the semiconductor material is expensive to produce. This is particularly true of epitaxially grown semiconductor layers. To avoid such erosion, a modification of the invention is provided.

Accordingly, in a further aspect of the invention, a method of depositing a metal which is electropositive with respect to hydrogen in the electrochemical series on to a semiconductor includes the step of electrically connecting a sacrificial anodic electrode to the said semiconductor, such that, during electrolysis, electrolytic deposition takes place at a predetermined cathodic surface region of the said semiconductor whereas electrolytic erosion takes place preferentially at the surface of the sacrificial anodic electrode whereby erosion of anodic surface regions of the said semiconductor is at least partly avoided.

The sacrificial anodic electrode is preferably made from low-grade semiconductor material, so that when, for example, a semiconductor device made from high-grade semiconductor material is being electro-plated, the low-grade, rather than high-grade, semiconductor material is preferentially eroded.

It is a virture of this aspect of the invention that the erosion of expensive, high-grade semiconductor material during electroplating can be avoided.

As will be apparent from the foregoing, the present invention makes it possible to simply and cheaply carry out a whole range of deposition processes on to crystal materials. It is particularly significant in the field of semiconductors since it provides a simple method of depositing both rectifying and ohmic contacts on semiconductor materials, and in addition a new technique for doping semiconductors.

Figure 2:
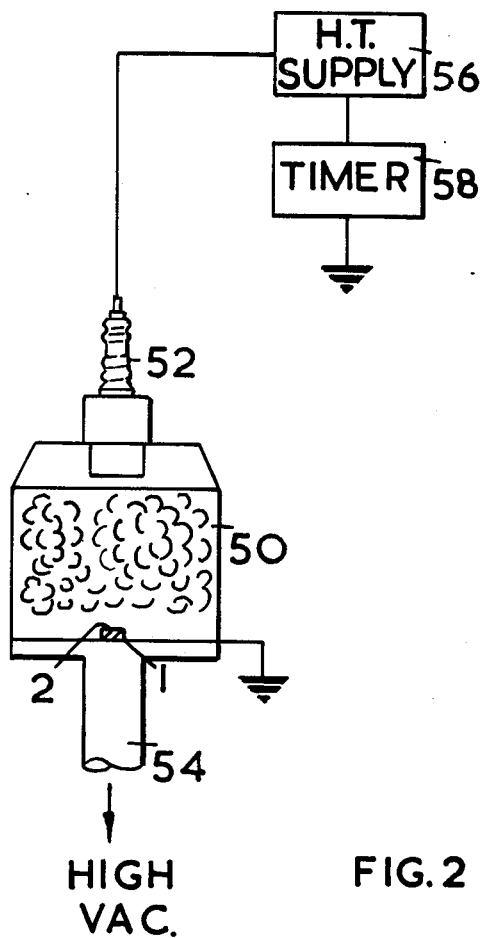
Figure 3:
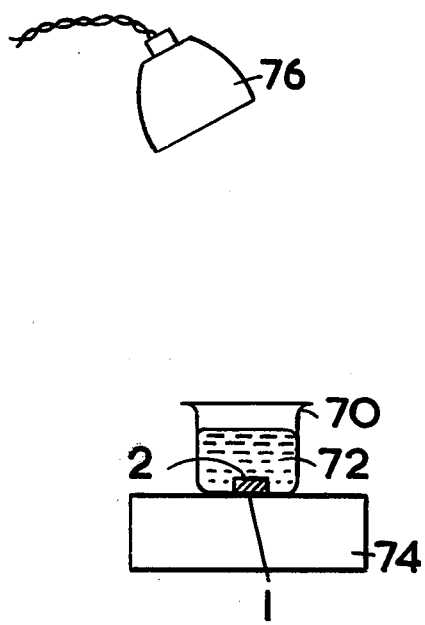
Figure 4:
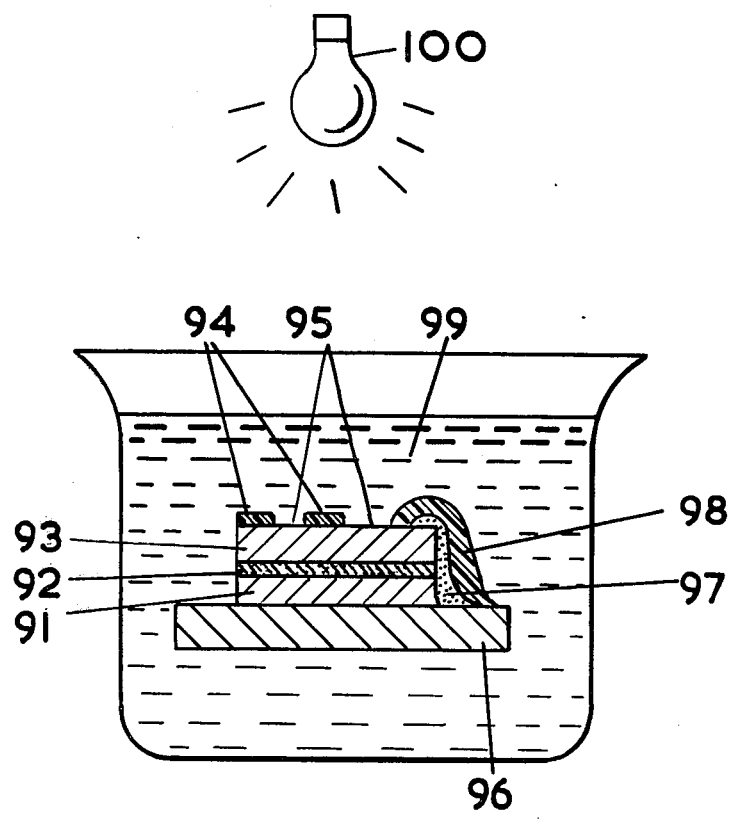

In order that the invention might be more fully understood and further features appreciated, the following descriptions will refer, by way of example only, to the accompanying FIGS. 1, 2, 3 and 4, in which:

FIG. 1 is a schematic illustration of a low power ion bombardment apparatus for use in connection with this invention, FIG. 2 illustrates a novel simple ion bombardment apparatus particularly suitable for use in connection with the present invention, FIG. 3 illustrates a simple apparatus for carrying out the deposition stage of a method in accordance with the present invention, and FIG. 4 illustrates the use of a sacrificial anodic electrode.

The following descriptive paragraphs of specific examples of the methods of the present invention refer, for convenience, almost exclusively to applications of the present invention to gallium arsenide. It should not, however, be construed from this that the invention, except where indicated in the consistory clauses, is to be narrowly interpreted as being solely applicable to this one material; very many applications to other crystal semiconductor materials are possible and one particularly important alternative is to silicon.

The first stage of the method of the present invention comprises ion bombardment to produce damage in the lattice structure adjacent at least a portion of the surface of a semiconductor such as gallium arsenide.

A common requirement in semiconductor technology is to deposit material over more extensive areas of a crystal than merely narrow lines. Bombardment of at least part of the surface of the material with a stream of particles is a particularly simple way of achieving the requisite lattice disturbance. Alternative apparati suitable for carrying out this bombardment are illustrated in FIGS. 1 and 2.

In FIG. 1 a slice of gallium arsenide crystal 1 is mounted at the end of a conventional low energy ion bombardment apparatus generally indicated by the number 10. The ion bombardment apparatus comprises an ion source 12 operated by a low energy, typically 5 KV, supply 14. Hydrogen ions from the source 12 are directed through conventional focussing and collimator means 16 to a transverse magnetic field generated by a spectrum magnet 18 (usually an electromagnet whose coil axis is normal to the direction of motion of the beam); the spectrum magnet 18 deflects ions in the beam into paths according to their mass. The beam 19 of hydrogen ions enters a shutter arrangement 20 arranged as a normal camera shutter. Operation of the shutter 20 enables a sample chamber 22 to be selectively exposed to a bunch of hydrogen ions 21. The number of ions in a bunch 21 may be varied simply by alteration of the "exposure time" of the shutter 20.

A sample of gallium arsenide 1 is placed in the sample chamber 22 with the face 2 to be bombarded exposed to the beam 21. A mask may be provided if this is required for the particular application in mind. The sample chamber 22 is connected to a pump 24 by a duct 26. The sample chamber 22 is maintained at high vacuum conditions.

An alternative and much simpler arrangement is illustrated in FIG. 2. The apparatus comprises a sample chamber 50 in which a spark plug 52 is utilised to induce a discharge of gas in the chamber. The gas would be very low pressure hydrogen, for hydrogen bombardment of samples 1, for bombardment by heavier ions a suitable gas is chosen eg $N_2$, Ar. The sample chamber 50 is connected through a duct 54 to the high vacuum side of a pump (not shown).

The spark plug 52 is operated by an adjustable high tension supply 56 controlled by a timer 58. Electrical discharge in the gas in the sample chamber 52 produces ions in the gas therein, the ions bombard the upper surface 2 of a sample 1 in the sample chamber 50. The samples 1 may be masked if required.

The ion bombardment apparatus as described either with respect to FIG. 1 or to FIG. 2 provides a particularly convenient method of carrying out the lattice disturbance step of the present invention. However, it will be immediately apparent to one of normal skill in the art, that there are many other ways of disturbing the lattice structure of semiconductors without departing from the scope of the invention.

After disturbing the lattice as described in the preceding paragraphs the gallium arsenide is ready for the plating stage of the method. A simple apparatus is illustrated in FIG. 3. A slice of gallium arsenide 1 is placed in a beaker 70 containing an appropriate plating solution 72. The slice of gallium arsenide 1 is so placed in the beaker 70 such that the face 2 subject to lattice disturbance is uppermost. If it is wished to carry out the plating process at elevated temperature the beaker 70 may be placed on a hot plate 74; in other circumstances where it is wished to carry out the plating process at below room temperature the beaker 70 would be placed in a suitably cold environment. Radiant energy is a requirement of the plating process of the present invention; it has been found that light energy is particularly convenient for most purposes utilising gallium arsenide as it is transmitted by most normal plating solutions and is absorbed by gallium arsenide to generate free charge carriers. Accordingly a light source 76 is provided above the plating solution 72. Conveniently the light source 76 is a 60 watt tungsten lamp situated a suitable distance above the gallium arsenide 1. However any suitable light source could be used. Sunlight or fluorescent light is suitable; the deposition rate is dependent upon the light radiation intensity. Since gallium arsenide absorbs radiation above 1.4 eV carriers must be generated from wavelengths in the visible spectrum, the light source 76, therefore, is only contributing that part of the spectrum that is in the visible. Infrared is attenuated by the plating solution, which is mainly water.

Thicknesses of 4000 A of silver, gold and platinum have been plated on gallium arsenide using the techniques described. Typically deposition rate for silver is about 2000 A in 10 minutes, but the rate depends upon conditions such as the light intensity, the area of gallium arsenide exposed for light adsorption and the ratio of this area to the metal deposit area.

Once the lattice disturbed area is covered with a metal film it is no longer essential to preserve the damage during continued plating. The device may require heat treatment to produce the required electrical properties. Typically for gallium arsenide the heat treatment may be carried out at 450°–500° C for 10 minutes. After heat treating plating may be resumed using a light source to supply energy. Plating continues on an exchange basis exposed substrate going into solution in exchange for metal deposited.

Having plated one metal onto gallium arsenide it is possible to deposit another metal upon the first to obtain a double coating. An example of a requirement for such a coating is where silver contacts are top coated with gold (soft) to provide a ductile surface for connecting RF circuits and avoiding excessive force on the gallium arsenide. It has been found that if silvered areas are covered with metal the sample may be heat-treated and the contacts tested for electrical performance. Subsequently plating may be resumed in a gold plating solution using a light source to supply energy as before. No wires or connections are required and no gold will be deposited on the non-silvered areas. The continued electrodeposition on the silvered surface is a coulombic process where free carriers provide the current flow. Increasing light intensity increases the deposition rate.

As previously mentioned certain metals have different bombardment thresholds for deposition on semiconductors. Areas of gallium arsenide may be initially bombarded at a dose of $5 \times 10^{15}$ ions sq cm, subsequently further areas may be bombarded of a higher dose in excess of $5 \times 10^{16}$ ions sq cm. If now gallium arsenide is immersed in silver plating solution and radiative energy supplied, the silver will only deposit on those areas having the higher bombardment dose. The gallium arsenide may now be put in a platinum plating solution and radiative energy supplied, platinum will now be deposited on all the bombarded areas and on top of the silver. Heat treatment renders the silver deposit on the gallium arsenide an ohmic contact and the platinum deposit a rectifying barrier. Similarly gold and silver may be differentially deposited. By suitable selection of the areas on which deposits are made, this procedure can yield, for example, diodes and bipolar or field-effect transistors.

Silver is deposited in a standard silver cyanide bath with additions for fine grain if required. The solution temperature used is 20° C (room temperature) and is normal for this bath.

The gold plating solution used is also a standard commercial bath (Acid Gold Solution "ENGLEHARD E56"). The solution temperature used is of the order 50° C which is normal for this solution.

The platinum plating solution used is also a standard commercial bath (J AND H DMS plating solution) which is used at about 50° C and 20° C (room temperature) and at temperature near 3° C.

It has been found that plating at 3° C with Platinum provides rectifying barriers capable of surviving a heat treatment process.

It is worth mentioning that for semi-conductors such as silicon which oxidize quickly to form an impervious oxide coating it is desirable that the plating solution should contain a reducing agent or should dissolve oxide coatings of this nature; alkali containing plating solutions provide one simple way of overcoming the problem. Although gallium arsenide forms an oxide coating it is insufficiently thick to cause any problems with the plating process.

Adherence of the gold, silver and platinum deposits on gallium arsenide is strong even before heat treatment, silver and platinum deposits being particularly strong. To test the adherence of the deposits some 2,200 dots in gold, silver and platinum were deposited on both n-type and p-type gallium arsenide using the method of the present invention of which about half the specimens were heat treated. Adhesive tape was stuck on the dots and then subsequently removed, only in one case did the metal deposit come away with the adhesive tape. Gold deposits are softer than either platinum or silver as is to be expected; probing with hard probes can scratch through the gold to the semiconductor underneath if thin gold deposits are used. This does not mean, however, that the adherence of gold is poor, all the gold dot test deposits (many hundreds) have withstood the adhesive tape test described above both before and after heat treatment.

With the idea of making submicron deposits on gallium arsenide, experiments have been made to determine the definition of the deposits. A collimated proton beam bombarded a gallium arsenide substrate through a metal mask to induce lattice disturbance in the surface where a metal deposit was required. The definitions of the subsequent plating depends on the amount of spread of the plating beyond the proton defined pattern. The finest definition measured was 0.1 $\mu$m of silver deposited, and the smallest silver particles resolved were less than 0.05 $\mu$m. Smaller particles still could be seen but not focussed.

Proton bombardment of the gallium arsenide through a window resist mask applied by conventional optical and development techniques has achieved 4 $\mu$m definition, this is the limit of the particular resist mask and not the plating technique. By employing an electron microscope to define a very fine resist window, 0.3 $\mu$m pattern definition has been achieved.

The electrical characteristics of deposited silver, gold and platinum layers on gallium arsenide deposited from plating solutions after hydrogen bombardment were examined. In the case of silver a proton dose of $5 \times 10^{16}$/sq cm (just above the threshold for silver) produces "soft" rectifying characteristics after plating. Increasing the proton dose to $10^{18} - 10^{19}$ protons/sq cm produce ohmic contacts. Heat treating makes the rectifying barriers tend to go ohmic, ohmic contacts made after proton doses of $10^{18} - 10^{19}$ protons/sq cm become low resistance (the specific contact resistance achieved is in the order of $3 \times 10^{-4}$ ohm cm$^2$. This compares well with the standard sputtered and heat treated contacts, however with further adjustment of the proton dose, the bombardment range and the heat treating process further improvement of the specific resistance should be obtainable.

Platinum plating on bombarded gallium arsenide can produce ohmic or rectifying barriers depending on the hydrogen dose and the plating solution temperature. At 50° C hydrogen dose of $10^{18} - 10^{19}$ ions/sq cm provide near ohmic contacts after plating, linearity improves on heat-treating but resistance remains high; proton doses of $10^{17}$ protons/sq cm produce rectifying barriers having "soft" characteristics after plating with a breakdown voltage of 4 to 10 volts, on heat-treating these contacts become ohmic; a proton dose of $10^{16}$ ions/sq cm produces a hard rectifying characteristic after plating having a breakdown voltage of 12 to 14 volts which heat-treating tends to make resistive; a $5 \times 10^{15}$/sq cm dose produces a "soft" rectifying contact after plating with a breakdown voltage of 8 to 10 volts which goes ohmic on heat-treating. It is clear that at 50° C it is possible to obtain rectifying characteristics by depositing platinum but these tend to become ohmic on heat-treating.

However by depositing platinum at room temperature it is possible to obtain rectifying characteristics which will survive heat-treating particularly up to proton doses of $10^{17}$ ions/sq cm, heat-treating "hardens" the rectifying characteristics. The hydrogen ion or proton current required to produce rectifying barriers is very small, eg a dose of $5 \times 10^{15}$ ions/sq cm and represents 120 nA/cm$^2$ of hydrogen ion current for one second.

Table 1 illustrates the breakdown voltage of various contacts obtained depositing platinum on gallium arsenide at room temperature.

| Bombardment (Hydrogen ions/ sq cm) | Voltage Breakdown Un-annealed | Heat-treated |
|---|---|---|
| $5 \times 10^{15}$ | 5V – 6V | 5V – 6V |
| $1 \times 10^{16}$ | 6V – 9V | 7V – 13V |
| $1 \times 10^{17}$ | 1V – 2V | 5V – 6V |
| $1 \times 10^{18}$ | HIGH RESISTANCE | HIGH RESISTANCE |
| $1 \times 10^{19}$ | HIGH RESISTANCE | HIGH RESISTANCE |

Gold deposits obtained from bombardment doses of $10^{19}$ ions/sq cm produce ohmic contacts having rather high resistance. Decreasing the proton dose brings into evidence a rectifying barrier characteristic. At $10^{16}$ ions/sq cm the breakdown voltage is about 5 to 9 volts. Plating occurs readily, however, as the threshold for plating is below $5 \times 10^{15}$ ions sq cm. For all hydrogen dose levels, heat treating produces ohmic characteristics. The lowest specific resistance achieved so far is $1 \times 10^{-3}$ $\Omega$ cm$^2$.

The results obtained above for silver, platinum and gold deposits have been obtained using bulk GaAs material $8 \times 10^{16}$ carriers/cc n-type Se doped. Repeat experiments with n-type epitaxial material sulphur doped having a concentration of $1 \times 10^{17}$ carriers/cc has substantiated the results.

Thus far the particular description has concerned the deposition of metals which are electropositive with respect to hydrogen in the electrochemical series. However, the invention is by no means confined to this aspect. In particular, the method described can be used for plating electronegative materials using appropriate plating solutions. Unlike the electropositive materials, electronegative materials are deposited and/or chemically reacted with those areas of the surface of the crystal which have not been subject to the lattice disturbance. This feature may be extremely useful for use in a process for doping, for example, gallium arsenide.

It is a characteristic of electrolysis that electrolytic deposition on one electrode surface is balanced by electrolytic erosion on a second electrode surface. The two electrode surfaces may be, for example, anodic and cathodic regions of the same semiconductor surface. Erosion of part of a semiconductor surface prepared by epitaxy, for example, is however disadvantageous since such surfaces are expensive to fabricate. An alternative aspect of the invention provides a method of electroplating metals onto semiconductor surfaces which minimises erosion of expensively fabricated semiconductor surfaces.

A specimen sample of semiconductor material suitable for electrolysis and employing a sacrificial anodic electrode is prepared as follows. A slice is cut from an n-type GaAs single crystal, and one flat surface of the slice is diffused with chromium ions to compensate out the donor and produce a semi-insulating surface. Vapour phase epitaxy is then employed to produce an n-type epilayer on the semi-insulating surface of the slice. A second slice of n-type GaAs, which can be of comparatively poor quality, is attached with adhesive to the surface of the first slice of GaAs remote from the epilayer. The epilayer is then partially coated with resist to define uncoated areas which are to be electroplated, and coated areas which are to be protected from plating.

The partially coated epilayer is bombarded in vacuo by a beam which may comprise positive or negative ions. The surface of the epilayer at this point carries exposed bombarded areas, which are subsequently to be electroplated, and resist-coated areas unaffected by bombardment, the epilayer being supported by a Cr-compensated substrate. The substrate is supported by a slice of low-grade n-type GaAs having a non-bombarded exposed surface, and the epilayer and low-grade n-type GaAs slice are connected together electrically. The combination of the substrate, epilayer and low-grade GaAs is immersed in an electroplating bath, such as for example a standard silver cyanide bath, and illuminated with light of a sufficiently short wavelength to generate free charge carriers in the GaAs. The non-bombarded exposed surface of the low-grade n-type GaAs then becomes anodic and is eroded by the electroplating solution, whereas the bombarded exposed areas of the epilayer become correspondingly cathodic and are plated by positive ions from the electroplating solution.

FIG. 4 shows a typical arrangement for electroplating a semiconductor surface material employing a sacrificial anodic electrode. An n-type single crystal slice of GaAs 91 has a chromium diffused surface layer 92 on which an epilayer 93 has been produced by vapour epitaxy. Resist layers 94 mask regions of the surface of the epilayer 93 and define unmasked regions 95 which have been subjected to bombardment by a nitrogen ion beam at flux of $5 \times 10^{16}$ cm$^{-2}$ sec$^{-1}$. The single crystal slice 91 is supported by a slice of bulk, and therefore comparatively inexpensive, n-type GaAs 96. The epilayer 93 and bulk GaAs 96 are connected together electrically by a layer of electrically conducting paint 97, the layer of paint 97 being coated with an insulating layer of resist 98. The composite semiconductor is immersed in a silver cyanide electroplating solution 99. Visible light from a tungsten lamp 100 is employed to irradiate the various semiconductor layers to generate free charge carriers therein reducing the resistance of the composite semiconductor. An ionic current then flows in the electrolyte, and silver is deposited on the unmasked cathodic regions 95. The low-grade GaAs slice 96 is anodic and becomes eroded. Since some of the regions being illuminated are not plated, ie the exposed upper surface of the slice 96, plating does not stop when the cathodic regions 95 are completely obscured. Hence comparatively thick layers can be deposited and fine control of plating thickness can be achieved by means of varying the light intensity. Plating thicknesses of up to 1 micron have been deposited, typically 0.4 micron of silver is deposited in ten minutes at a light intensity of 700 $\mu$Wcm$^{-2}$. No plating occurs if no light energy is supplied and no connections are required to the semiconductor slice from outside. The simplicity of the operation lends itself to automation and reliable device production.

The basic advantage of employing a sacrificial anodic electrode is that low-grade GaAs can be eroded when a comparatively expensive semiconductor sample is being plated. This avoids the electrolytic erosion of expensive material which would otherwise take place. All that is required is an electrical connection, which may be a simple wire for example, between the sacrificial anode and the previously bombarded cathode. Areas not required to be plated or eroded, including the electrical connection between anode and cathode, are insulated from the plating solution by a layer of resist or other convenient insulating material. To produce the cathodic surface, many types of ion beam are suitable for producing surface damage. Bombardment by protons, on alternatively nitrogen or argon ions from glow discharges or as collimated beams, have been successively employed. The finest dimension plated into a resist window to date is 0.3 micron, the resist window being cut by an electron beam. The technique is not restricted to GaAs semiconductor material, other semiconductors can be plated in this manner.

Those skilled in the art of semiconductor manufacture will appreciate that many variations are possible in the use of the invention without departing from the scope of the invention. Electrolytic deposition of materials as described above includes deposition of electropositive and electronegative materials, and the deposition of electropositive materials may be accompanied by the use of a sacrificial anode. It is quite clear that the present invention has wide application in solid state fabrication technology.

It should be noted that in the production of many semiconductor devices the manufacturing processes involves cleaving or likewise treating much larger semiconductor crystals. Cleavage lines will provide centres for the growth of layers of materials when subject to the process of the present invention. It should thus be remembered that it is advisable to remove all internal stresses and disturbances in the lattice structure of a semiconductor by heat-treating or masking those areas of the surface before carrying out the method of the present invention if unwanted depositions are to be avoided.

What is claimed is:
1. A method of depositing a material onto a semiconductor having a surface lattice structure including successive the steps of:
   1. bombarding the semiconductor with a beam of ions to produce damage in the surface lattice structure,
   2. immersing the semiconductor in an electroplating solution suitable for depositing the said material onto the semiconductor, and
   3. supplying radiative energy to the semiconductor, the said radiative energy consisting at least partially of a wavelength sufficiently short to generate free carriers in the semiconductor, in order to deposit the said material from the electroplating solution onto the semiconductor.

2. A method of depositing a material onto a semiconductor according to claim 1 in which the surface lattice structure is damaged by bombardment of the semiconductor surface by a beam of ions of at least one chemical species selected from the group comprising those which do not significantly affect the electrical properties of the semiconductor material bombarded.

3. A method of depositing a material onto a semiconductor according to claim 2 in which the material to be deposited is an element which forms negative ions when in solution, deposition of the said element taking place on non-bombarded regions of the semiconductor surface lattice structure.

4. A method of depositing material onto a semiconductor according to claim 3 in which material is deposited in a predetermined pattern by the step of bombarding only such areas of the semiconductor surface lattice structure on which material is not required to be deposited.

5. A method of depositing a metal electropositive with respect to hydrogen in the electrochemical series onto a semiconductor, the semiconductor having a surface lattice structure, which method includes the successive steps of:
  1. bombarding the semiconductor with a beam of ions to product damage into at least a part of the surface lattice structure of the semiconductor while preserving the chemical composition and crystallinity of the surface lattice structure,
  2. immersing the semiconductor in an electroplating solution containing ions of the said metal, the said solution being adapted for electroplating the said metal ions onto the semiconductor,
  3. supplying radiative energy to the semiconductor, the said radiative energy consisting at least partially of a wavelength sufficiently short to generate free carriers in the semiconductor, in order to deposit the said metal onto the disturbed surface lattice structure of the semiconductor.

6. A method of depositing a metal onto a semiconductor according to claim 5 in which the surface lattice structure of the semiconductor is damaged by bombardment of the semiconductor surface by a beam of ions of at least one chemical species selected from the group comprising those which do not significantly affect the electrical properties of the semiconductor material bombarded.

7. A method of depositing a metal onto a semiconductor according to claim 6 in which the semiconductor is gallium arsenide and the metal is selected from the group comprising silver, gold and platinum.

8. A method of depositing a metal onto a semiconductor according to claim 6 in which deposition to a predetermined pattern is effected by the step of bombarding selectively only such areas of the semiconductor on which the said metal is required to be deposited.

9. A method of depositing a metal onto a semiconductor according to claim 8 in which the method includes the step of etching the semiconductor subsequent to bombardment and prior to deposition of the metal so that non-bombarded regions of the semiconductor are preferentially eroded.

10. A method of depositing multiple layers of metal onto a gallium arsenside crystal, each metal being selected from the group comprising silver, gold and platinum, the said method including the steps of:
  1. Depositing a first metal by the method of claim 9.
  2. Placing the gallium arsenide crystal in a solution suitable for electroplating a second metal onto gallium arsenide, and
  3. Supplying radiative energy to the gallium arsenide crystal, the said radiative energy consisting at least partially of a wavelength sufficiently short to generate free carriers in gallium arsenide, in order to deposit the said second metal on top of the said first metal.

11. A method of depositing a plurality of different metals onto respective surface regions of a semiconductor comprising the steps of:
  1. Bombarding each surface region with a respective dose of ions, each dose being sufficiently large to make a respective metal deposit on the respective surface region when immersed in an appropriate respective solution containing ions of the respective metal and irradiated with light consisting at least partially of a wavelength sufficiently short to generate free carriers in the semiconductor, and
  2. Immersing the semiconductor in successive solutions each containing ions of a respective metal to be deposited, the order of immersion in successive solutions being in descending order of the respective ion dosage required to make the respective metal deposit from the respective solution onto the semiconductor when irradiated with light consisting at least partially of a wavelength sufficiently short to generate free charge carriers in the semiconductor, the semiconductor being irradiated with the said light during each immersion.

12. A method of depositing a layer of silver onto a first surface region of a gallium arsenide crystal semiconductor and a second metal selected from the group comprising gold and platinum onto a second such surface region, which method comprises the steps of:
  1. Bombarding the first surface region with protons to achieve a dose of more than $5 \times 10^{16}$ ions/sq cm
  2. Bombarding the second surface region with protons to achieve a dose of less then $5 \times 10^{16}$ ions/sq cm
  3. Immersing the gallium arsenide crystal in a silver electroplating solution.
  4. Supplying radiative energy to the gallium arsenide, the said radiative energy consisting at least partially of a wavelength sufficiently short to generate free charge carriers in the gallium arsenide crystal, so that the first surface region becomes plated with silver.
  5. Immersing the gallium arsenide in a solution suitable for plating the said second metal onto gallium arsenide, and
  6. Supplying radiative energy to the gallium arsenide, the said radiative energy consisting at least partially of a wavelength sufficiently short to generate free charge carriers in the gallium arsenide crystal, so that at least the second surface region becomes plated by the said second metal.

13. A method of depositing a metal onto a semiconductor according to claim 5 including the further step of electrically connecting to the said semiconductor a sacrificial anodic electrode, such that, during electrolysis, electrolytic deposition takes place at a predetermined cathodic surface region of the said semiconductor whereas corresponding electrolytic erosion takes place at least partially at the surface of the sacrificial anodic electrode whereby erosion of anodic surface regions of the said semiconductor is at least partly avoided.

14. A method of depositing a metal onto a semiconductor according to claim 6 including the further step of electrically connecting to the said semiconductor a sacrificial anodic electrode, such that, during electrolysis, electrolytic deposition takes place at a predetermined cathodic surface region of the said semiconductor whereas corresponding electrolytic erosion takes place at least partially at the surface of the sacrificial anodic electrode whereby erosion of anodic surface regions of the said semiconductor is at least partly avoided.

15. A method of depositing a metal onto a semiconductor according to claim 7 including the further step of electrically connecting to the said semiconductor a sacrificial anodic electrode, such that, during electrolysis, electrolytic deposition takes place at a predetermined cathodic surface region of the said semiconductor whereas corresponding electrolytic erosion takes place at least partially at the surface of the sacrificial anodic electrode whereby erosion of anodic surface regions of the said semiconductor is at least partly avoided.

16. A method of depositing a metal onto a semiconductor according to claim 8 including the further step of electrically connecting to the said semiconductor a sacrificial anodic electrode, such that, during electrolysis, electrolytic deposition takes place at a predetermined cathodic surface region of the said semiconductor whereas corresponding electrolytic erosion takes place at least partially at the surface of the sacrificial anodic electrode whereby erosion of anodic surface regions of the said semiconductor is at least partly avoided.

17. A method of depositing a metal onto a semiconductor according to claim 9 including the further step of electrically connecting to the said semiconductor a sacrificial anodic electrode, such that, during electrolysis, electrolytic deposition takes place at a predetermined cathodic surface region of the said semiconductor whereas corresponding electrolytic erosion takes place at least partially at the surface of the sacrificial anodic electrode whereby erosion of anodic surface regions of the said semiconductor is at least partly avoided.

18. A method of depositing a metal onto a semiconductor according to claim 10 including the further step of electrically connecting to the said semiconductor a sacrificial anodic electrode, such that, during electrolysis electrolytic deposition takes place at a predetermined cathodic surface region of the said semiconductor whereas corresponding electrolytic erosion takes place at least partially at the surface of the sacrificial anodic electrode whereby erosion of anodic surface regions of the said semiconductor is at least partly avoided.

19. A method of depositing a metal onto a semiconductor according to claim 11 including the further step of electrically connecting to the said semiconductor a sacrificial anodic electrode, such that, during electrolysis, electrolytic deposition takes place at a predetermined cathodic surface region of the said semiconductor whereas corresponding electrolytic erosion takes place at least partially at the surface of the sacrificial anodic electrode whereby erosion of anodic surface regions of the said semiconductor is at least partly avoided.

20. A method of depositing a metal onto a semiconductor according to claim 12 including the further step of electrically connecting to the said semiconductor a sacrificial anodic electrode, such that, during electrolysis, electrolytic deposition takes place at a predetermined cathodic surface region of the said semiconductor whereas corresponding electrolytic erosion takes place at least partially at the surface of the sacrificial anodic electrode whereby erosion of anodic surface regions of the said semiconductor is at least partly avoided.

21. A gallium arsenide field effect transistor made by the method of claim 7.

* * * * *